Jan. 14, 1936. L. A. HAZELTINE Re. 19,823
ANTENNA COUPLING SYSTEM
Original Filed Nov. 4, 1930
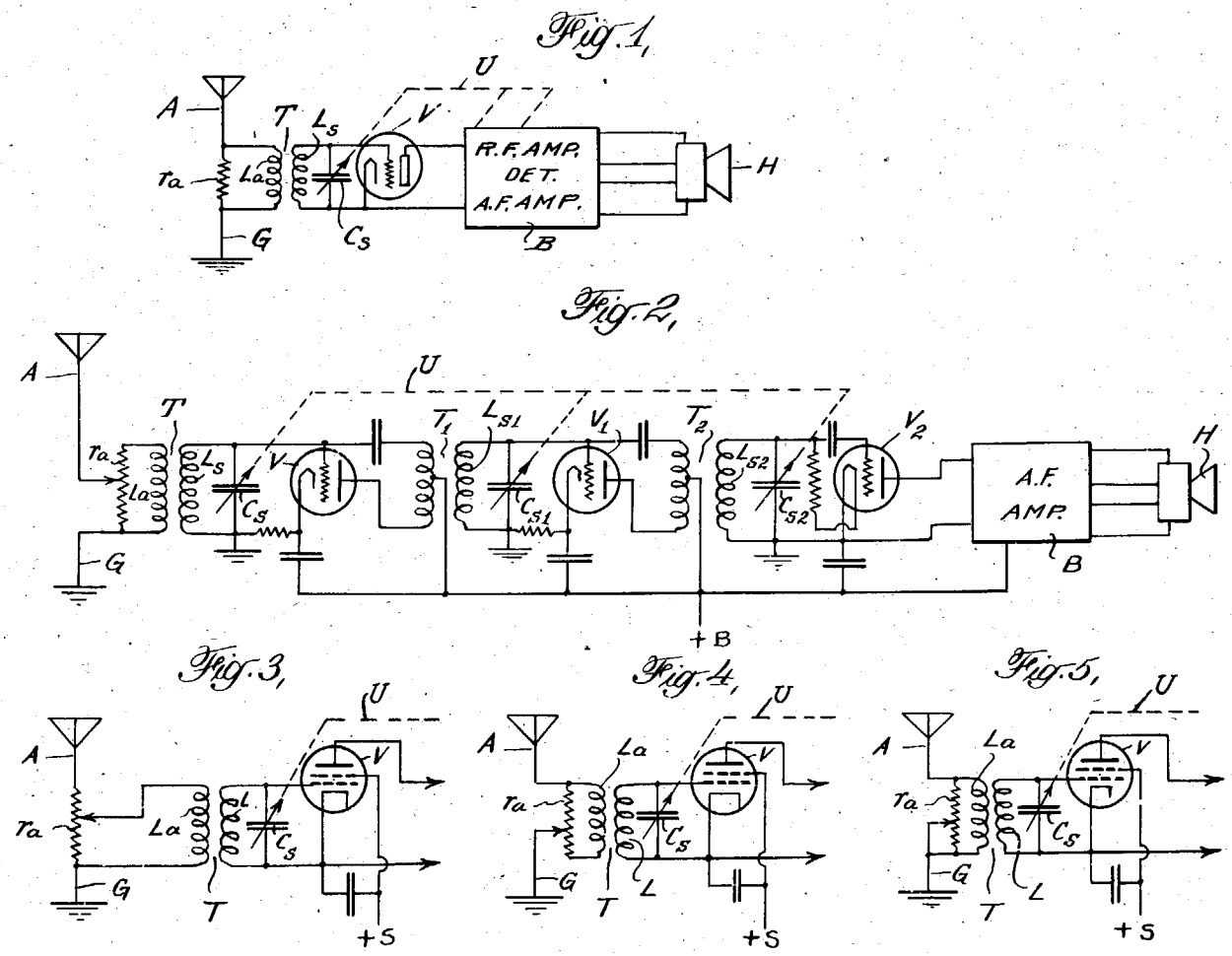
INVENTOR
Louis A. Hazeltine,
BY
Pennie, Davis, Marvin and Edmonds,
ATTORNEYS Reissued Jan. 14, 1936 Re. 19,823

UNITED STATES PATENT OFFICE 19,823

ANTENNA COUPLING SYSTEM

Louis A. Hazeltine, Hoboken, N. J., assignor to Hazeltine Corporation, a corporation of Delaware Original No. 1,852,710, dated April 5, 1932, Serial No. 493,370, November 4, 1930. Application for reissue November 16, 1935, Serial No. 50,235

6 Claims. (Cl. 250—20)

This invention relates to electric coupling circuit arrangements for coupling a receiving capacity-type antenna to a thermionic tube, particularly a thermionic tube constituting the first stage of a multi-stage tuned radio-frequency amplifier in which all stages are tuned by variable condensers mechanically connected by a single control.

More especially the invention is directed toward improvements in antenna coupling circuits of the type disclosed in United States Letters Patent No. 2,022,514, granted November 26, 1935, upon the application of Wm. A. MacDonald wherein the antenna is coupled to a thermionic tube by means of a transformer having a tunable secondary coil and a primary coil coupled thereto having sufficient inductance so that it resonates with the capacity of an average antenna at a frequency slightly below the tunable frequency range in order to increase the response at the lower tuned frequencies, and thereby offset to a desired extent the factors normally operative in the well known manner to produce an increase in response as the frequency of tuning is increased.

The consideration which limits the voltage step-up ratio obtainable between primary and secondary circuits of the coupling transformer, is in general, the detuning effect of the primary circuit upon the secondary circuit when antennas are employed having capacities differing widely from that of the average antenna. Since any change in antenna capacity from the average value is reflected into the secondary circuit by virtue of the primary-to-secondary coupling effects, it is necessary that the effective coupling between transformer windings be made sufficiently small so that the detuning effect of the antenna is negligible. The effective coupling however should not be reduced any further than is required to effect this end, since an unnecessary loss in sensitivity would result.

When antennas which have greater than average capacity are used in systems of the type described, (the present invention not being employed) the resonance frequency of the primary circuit is reduced and thereby removed further from the tuning range of the receiver. The detuning effect therefore of a larger than average antenna capacity, or even of a short-circuit across the primary winding of the coupling transformer, is relatively small. When antennas are employed having less than average capacity, the resonance frequency of the primary circuit approaches the tuning range, and in some cases even falls within the range, in which event the detuning effect tends to become very large.

It is one of the primary objects of the present invention to avoid such a contingency by the addition of a resistance in shunt to the input terminals of the coupling transformer primary winding. The maximum value of this resistance is chosen sufficiently large to have negligible effect on the performance of the circuit for antennas having average or greater than average capacity. On the other hand this maximum value of shunt resistance is chosen sufficiently small so that it serves to prevent any sharp resonance effects in the primary circuit (which normally is resonant at about the lowest frequency of the tuning range) when the antenna has less than average capacity. In this way the detuning effects reflected into the secondary circuit of the coupling transformer which are due to variations in the antenna capacity, can be held within as close limits as required in order to permit uni-control tuning in the case of a multi-stage tuned radio-frequency amplifier coupled to the antenna circuit.

Another important function of the resistance connected, in accordance with this invention, in shunt to the primary winding of the coupling transformer, is to limit the response at the resonant frequency of the primary circuit when the antenna capacity is such as to produce resonance within or slightly below the tunable frequency range, since otherwise the antenna coupling circuit would be unduly responsive at the lower frequencies of tuning.

The shunt resistance can be very conveniently made in the form of a variable resistor or potentiometer serving to variably couple the antenna circuit to the input of the coupling transformer, in this way providing a manually operable volume control for adjusting the intensity or attenuation of the received signal. This dualistic function of the shunt resistance constitutes a second important object of this invention.

To attain the full advantages of this invention, the self-inductance of the coupling transformer primary winding, the coefficient of coupling between the primary and secondary windings, and the magnitude of the resistance shunting the primary winding, should have values which are related to the frequency, to the antenna capacity and to the constants of the tuned secondary circuit in accordance with rules stated below.

Referring to the drawing:

Fig. 1 shows schematically a multi-stage tuned radio-frequency receiving system connected to an antenna by means of a coupling circuit in accordance with this invention, wherein the resistance in shunt to the coupling transformer primary winding is fixed;

Fig. 2 shows a modification of the invention as applied to a multi-stage uni-controlled tuned radio-frequency receiving system wherein the resistance in shunt to the antenna coupling transformer primary winding is shown in the form of a potentiometer variably coupling the antenna circuit to the receiver input;

Figs. 3, 4 and 5 show other schemes, interchangeable with the antenna coupling system of Fig. 2, of employing a variable resistor or a potentiometer for variably coupling the antenna circuit to the transformer primary winding, which attain the objects of this invention.

In Fig. 1 the coupling system consists of a transformer T having a primary coil $L_a$ and secondary coil $L_s$. The primary coil is connected in parallel with the resistor $r_a$ between antenna A and ground G, the capacity between antenna and ground being denoted by $C_a$. The primary coil is magnetically coupled to the secondary $L_s$, the latter being connected in parallel with the tuning condenser $C_s$ between grid and cathode of a thermionic tube V.

This circuit may be employed by itself, in case it is desired simply to have a coupling system whose tuning adjustment may be calibrated independently of the antenna constants, or else it may be followed by other tuned amplifying stages, either with separate tuning controls or a single tuning control.

In the circuit of Fig. 1, however tube V is indicated as constituting the first stage of a multi-stage tuned radio-frequency receiving system, the succeeding stages of which, as well as the detector and audio-frequency amplifying stages, are indicated by the rectangle B, the output of which is connected to a loud speaker H. The condenser $C_s$ is mechanically coupled to the corresponding condensers of the succeeding radio-frequency amplifying stages by means of the uni-control element U.

The circuit arrangement for the radio-frequency amplifying stages is shown in detail in Fig. 2 wherein the successive tubes V to $V_2$, inclusive, of a multi-stage tuned radio-frequency thermionic receiving system are inter-connected by means of high-frequency transformers $T_1$ and $T_2$, the antenna circuit A being coupled to the first tube V by means of transformer T. The transformer secondary windings $L_s$, $L_{s1}$, $L_{s2}$ are tunable throughout a range in frequency by means of the associated variable condensers $C_s$, $C_{s1}$, $C_{s2}$ having their rotor elements mechanically coupled by means of the uni-control element U. Tube $V_2$, arranged to operate as a detector, is connected through an audio-frequency amplifier E to a loud speaker H. The grid-to-anode capacities of tubes V and $V_1$ are neutralized as shown in the drawing in accordance with the methods disclosed in my U. S. Patent No. 1,533,858 granted April 14, 1925. Instead of employing neutralized three-electrode tubes, as in this figure, it is sometimes desirable to use tubes having other means for suppressing the effects of interelectrode capacity coupling such as the screen grid of a four-electrode tube as in the remaining figures.

The resistance $r_a$ in shunt to the primary winding $L_a$ of transformer T is arranged in the form of a potentiometer with the antenna A connected to the variable tap for controlling the signal intensity impressed upon the receiver input.

The inductance of the antenna coupling transformer primary winding $L_a$, in order to accomplish the results of the present invention, is made greater than or at least equal to that of the secondary winding $L_s$. The following notation will be employed in a detailed description of a preferred embodiment of the antenna coupling circuit:

$\omega$, angular frequency of signal, radians per micro-second;

$E_a$, signal voltage impressed upon the antenna, volts;

$E_s$, voltage developed across secondary winding $L_s$, volts;

$C_a$ antenna capacity, millimicrofarads;

$C_s$, secondary circuit tuning capacity, millimicrofarads;

$p_s$, ratio of total conductance of secondary circuit at resonance to the susceptance $\omega C_s$ (this ratio has been called the "natural power factor")

$k$, coefficient of coupling between transformer primary and secondary circuits.

$L_a$, actual self-inductance of primary coil, millihenries;

$L'_a = L_a(1-k^2)$, self-inductance of primary coil as measured with secondary coil in place and short-circuited, millihenries;

$L_s$, actual self-inductance of secondary coil millihenries;

$L'_s = L_s(1-k^2)$, self-inductance of secondary coil as measured with primary coil in place and short-circuited, millihenries;

$r_a$, resistance shunting primary coil, kilohms.

The value $L_s$ should be so chosen that $L'_s$ is equal to the self-inductances $L_{s1}$ and $L_{s2}$ of the secondary coils of the succeeding transformers $T_1$ and $T_2$ respectively. That is, the self-inductance of the antenna transformer secondary winding is made larger than that of the interstage transformer secondary windings in accordance with the equation $$L_s = \frac{L_{s2}}{1-k^2} = \frac{L_{s3}}{1-k^2}. \tag{1}$$

The value of $C_s$ is made equal to the capacity $C_{s1}$ and $C_{s2}$ of the succeeding tuning condensers at all settings of the tuning control U, i. e. all tuning condensers are made identical. Under these conditions, and assuming that the tuning control is adjusted so that the interstage coupling circuits are in exact resonance at a desired frequency $\omega$, i. e., so that $$\frac{1}{\omega^2} = C_s L'_s = C_{s2} L_{s2} = C_{s3} L_{s3}$$

the voltage step-up ratio of the antenna coupling system is:

$$\frac{E_s}{E_a} = \frac{k}{p_s} \cdot \frac{\omega^2 C_a \sqrt{L'_a L'_s}}{\sqrt{(\omega^2 C_a L'_a - 1)^2 + \left(\frac{k^2}{p_s} + \frac{\omega L'_a}{r_a}\right)^2}}. \tag{2}$$

In deriving Equation (2), the resistance and natural capacity of the primary coil $L_a$, and the resistance and self-inductance of the antenna A have been neglected, which is legitimate with ordinary values of these quantities. It may be noted that although the antenna coupling system itself is not quite in tune, the deviation from exact resonance is too slight to cause a serious departure from the peak of the resonance curve when the constants are chosen in the manner described below; and this deviation is fully taken into account in the above equation.

The effective width of the frequency band covered by the antenna coupling system exceeds that covered by the secondary circuit $L_sC_s$ alone, in the ratio of the above denominator to its value when $k=0$; that is, in the ratio $$(3)\qquad \sqrt{\frac{(\omega^2C_aL'_a-1)^2+\left(\frac{k^2}{p_s}+\frac{\omega L'_a}{r_a}\right)^2}{(\omega^2C_aL'_a-1)^2+\left(\frac{\omega L'_a}{r_a}\right)^2}}.$$

This ratio is greatest when the antenna circuit is in resonance ($\omega^2C_aL'_a=1$), its valve then being $$(4)\qquad 1+\frac{k^2}{p_s}\Big/\frac{\omega L'_a}{r_a}.$$

Now it will be observed that the factors $\omega$ and $C_a$ occurring in the numerator of Equation (2) indicate a tendency for the voltage step-up ratio to assume a low value at low tuned frequencies and small antenna capacities. In order to increase the response under such conditions, the denominator of Equation (2) must be kept as small as posible, which can be accomplished by making $\omega^2C_aL'_a$ of the order of unity at the lowest value of $\omega$ to be used. Then the first parenthesis $(\omega^2C_aL'_a-1)^2$ of the denominator of Equation (2) will be approximately zero at the lower frequencies of tuning for all values of antenna capacity up to and slightly less than that of the average antenna. Under these conditions, the voltage step-up ratio will be highest when the second parenthesis in the denominator of Equation (2) is also of the order of unity. In this parenthesis the term $$\frac{\omega L'_a}{r_a}$$

lowers the step-up ratio, but by Equation (4) it also keeps the frequency band from being too greatly widened. A value of the order of one-third to one-seventh at the lowest frequency of tuning represents a suitable compromise, which is sufficiently high to prevent excessive response at the resonance frequency of the antenna circuit when the secondary circuit $L_sC_s$ is tuned to a different frequency.

The results derived from an analysis of the above equations may be embodied in the following rules:

(I) The self-inductance of the primary coil $L_m$ should be so chosen that it resonates with the capacity of an average antenna at about the lowest frequency to which the system is to be tuned, preferably at a frequency which is slightly lower than the lowest tuned frequency.

(II) The coupling coefficient between the primary and secondary circuits of the antenna coupling system should be of the order of somewhat less than the square root of the natural power factor of the secondary circuit.

(III) The resistance $r_a$ shunting the primary winding $L_m$ should be of the order of from three to seven times the reactance of the primary coil $L_m$ at the lowest tuned frequency. If the resistance is adjustable, this refers to its maximum value.

In the modification of Fig. 2 it will be noted that the entire resistance $r_a$ is at all times connected across the primary winding $L_m$ of the antenna coupling transformer, with the variable tap extending to the antenna A. The modification of Fig. 3 differs from that of Fig. 2 in that the resistance $r_a$ is serially included in the antenna circuit with the lower terminal of the coupling transformer primary winding $L_m$ connected to the grounded terminal of the resistance, and with the upper terminal of coil $L_m$ variably tapped to the resistance $r_a$.

In Fig. 4 the resistance $r_a$ is at all times bridged across the coil $L^a$ with the antenna connected to the upper terminal of the resistance and the ground G variably tapped thereto. The modification of Fig. 5 differs from that of Fig. 4 by strapping the lower terminal of resistance $r_a$ to ground G, so that the portion of the resistance up to the variable tap is short circuited.

Capacitive coupling, which may be inherent or added in the form of a condenser between the primary and secondary transformer coils can either add to or subtract from the magnetic coupling, as described in the MacDonald patent previously referred to. Rule (II), above, gives the total coupling at the lowest frequency, which is practically all magnetic coupling. With moderate additive capacitive coupling, the voltage step-up ratio at higher frequencies will be improved, except with very small antenna capacities; but the added capacitive coupling at its greatest value (lowest $C_a$ and lowest $C_s$) should not exceed the order of magnitude of the magnetic coupling.

The following values are suitable for broadcast reception as employed in the United States (0.55 to 1.5 cycles per micro-second) and illustrate the above rules:

$C_a=0.2$ millimicrofarads, average antenna;

$p_s=0.01$ $L'_a=0.2$ millihenries $\omega=2\pi\times0.55=3.46$ radians per microsecond;

Then $$L'_s=\frac{1}{\omega^2C_a}=\frac{1}{(3.46)^2\times0.2}=0.419 \text{ millihenry}$$

$$k=0.8\sqrt{p_s}=0.8\sqrt{0.01}=0.08$$

$$r_a=5\omega L'_a=5\times3.46\times0.419=7.23 \text{ kilohms}$$

$$L_s=\frac{L'_s}{1-k^2}=\frac{0.2}{1-0.08^2}=0.2013 \text{ millihenries.}$$

Using these values for the constants, the voltage step-up, by Equation (2), lies between 6 and a little over 8 throughout the broadcast band of frequencies.

A disadvantage of the modification of Figs. 2 and 3 resides in the fact that the adjustable contact arm of resistance $r_a$ being at an ungrounded potential requires an insulating mechanical element for adjusting the same. A further disadvantage is that with the adjustable contact set at other than the maximum position, a portion of the resistance is serially included in the resonant primary circuit $L_aC_a$ thereby reducing the selectivity and otherwise introducing a detuning action due to the primary circuit impedance reflected into the turned secondary circuit $L_sC_s$. This latter objection also applies to the Fig. 4 showing.

Fig. 5 is thus the preferred embodiment wherein the adjustable contact is always at ground potential, the resistance $r_a$, regardless of the adjustment thereof being at all times entirely in shunt to the primary circuit $L_aC_a$. With this arrangement it is obvious that adjustment of the contact arm to an intermediate point has an inappreciable effect upon the tuning of the secondary circuit.

What is claimed is:

1. A high-frequency coupling circuit tunable throughout a frequency range and adapted primarily for coupling a capacity type antenna to the input of a thermionic tube, comprising, a tunable secondary circuit having coupled thereto a primary circuit including inductance sufficient to resonate with a certain antenna capacity at a frequency fixed at about the lowest frequency of said tunable range, and shunt resistance associated with said primary circuit sufficiently high in maximum magnitude to have an inappreciable effect upon the operation of said coupling circuit when connected to an antenna having said certain capacity, said magnitude being sufficiently low to prevent serious detuning for a given frequency adjustment of said tunable secondary circuit when said primary circuit is connected to an antenna of less than said certain capacity.

2. A high-frequency coupling circuit tunable throughout a frequency range and adapted primarily for coupling a capacity type antenna to the input of a thermionic tube comprising, a tunable secondary circuit having coupled thereto a primary circuit including inductance sufficient to resonate with the capacity of said antenna at a frequency fixed at about the lowest frequency of said tunable range, resistance connected in shunt to said primary circuit having a maximum magnitude of the order of three to seven times the reactance of said primary-circuit inductance at the lowest frequency of said tuning range.

3. A high-frequency coupling circuit tunable throughout a frequency range and adapted primarily for coupling a capacity type antenna to the input of a thermionic tube, comprising, a tunable secondary circuit including inductance and capacity, having coupled thereto a primary circuit including inductance sufficient to resonate with the capacity of said antenna at a frequency fixed at about the lowest frequency of said tunable range, and shunt resistance associated with said primary circuit, the coupling coefficient between said primary and secondary circuits being of the order of somewhat less than the square root of the natural power factor of said secondary circuit.

4. A high-frequency circuit tunable throughout a frequency range and adapted primarily for coupling a capacity type antenna circuit to the input of a thermionic tube, comprising, a transformer having a secondary coil tunable by means of an associated variable capacity, and a primary coil coupled to said secondary and having an inductance sufficient to resonate with the capacity of said antenna circuit at a frequency fixed at about the lowest frequency of said tunable range, and a resistance in shunt to said primary coil, the coupling coefficient between said primary and secondary coils being of the order of somewhat less than the square root of the natural power factor of the tunable secondary circuit, the maximum value of said resistance being of the order of three to seven times the reactance of said primary coil at the lowest frequency of said range.

5. A high-frequency coupling circuit tunable throughout a frequency range and adapted primarily for coupling a capacity type antenna circuit to the input of a thermionic tube, comprising, a tunable secondary circuit including variable capacity and a secondary transformer coil having magnetically coupled thereto a primary coil of inductance sufficient to resonate with a certain antenna capacity at a frequency fixed at about the lowest frequency of said tunable range, and resistance connected in shunt to said primary coil of a maximum magnitude sufficiently large to have an inappreciable effect upon the operation of said coupling circuit when connected to an antenna having said certain capacity, said magnitude being sufficiently small to prevent serious detuning for a given capacity setting of said tunable secondary circuit when said primary coil is connected to an antenna having less than said certain capacity.

6. A high-frequency coupling circuit adapted primarily for coupling a capacity type antenna to the input of a thermionic tube, comprising, a transformer having a secondary coil tunable throughout a frequency range by an associated variable capacity, and a primary coil of inductance sufficient to resonate with the capacity of an average antenna at a frequency fixed at about the lowest frequency of said tunable range, and a variable resistance in shunt to said primary coil and connected to variably couple an antenna circuit to said primary coil, the coupling coefficient between said primary and secondary coils being of the order of somewhat less than the square root of the natural power factor of the tunable secondary circuit, said resistance at the maximum setting having a magnitude sufficiently large to produce an inappreciable effect upon the operation of the said coupling circuit when connected to an antenna having said average capacity, but a magnitude sufficiently small to prevent serious detuning of said coupling circuit for a given setting of said variable capacity with said primary coil connected to an antenna of less than average capacity.

LOUIS A. HAZELTINE.